U.S. Patent Number: 5,272,367
Date of Patent: Dec. 21, 1993

United States Patent [19]
Dennison et al.

[54] FABRICATION OF COMPLEMENTARY N-CHANNEL AND P-CHANNEL CIRCUITS (ICS) USEFUL IN THE MANUFACTURE OF DYNAMIC RANDOM ACCESS MEMORIES (DRAMS)

[75] Inventors: Charles H. Dennison; Tyler A. Lowrey, both of Boise, Id.

[73] Assignee: Micron Technology, Inc., Bosie, Id.

[21] Appl. No.: 988,376

[22] Filed: Dec. 7, 1992

Related U.S. Application Data

[63] Continuation of Ser. No. 779,222, Oct. 18, 1991, abandoned, which is a continuation-in-part of Ser. No. 450,445, Dec. 11, 1989, Pat. No. 5,073,509, and a continuation-in-part of Ser. No. 485,007, Feb. 26, 1990, abandoned, which is a continuation-in-part of Ser. No. 189,411, May 2, 1988, Pat. No. 4,957,878, which is a continuation-in-part of Ser. No. 189,414, May 2, 1988, abandoned, which is a continuation-in-part of Ser. No. 189,412, May 2, 1988, Pat. No. 4,871,688.

[51] Int. Cl.$^5$ ............... H01L 29/68; H01L 29/78; H01L 29/92
[52] U.S. Cl. ................... 257/306; 257/369; 257/413; 257/900
[58] Field of Search ............ 357/23.6; 257/900, 306, 257/369, 413

[56] References Cited

U.S. PATENT DOCUMENTS

| | | | |
|---|---|---|---|
| 4,345,366 | 8/1982 | Brower | 29/571 |
| 4,970,564 | 11/1990 | Kimura et al. | 257/306 |
| 5,025,301 | 6/1991 | Shimizu | 357/23.6 |
| 5,032,530 | 7/1991 | Lowrey et al. | 437/34 |

FOREIGN PATENT DOCUMENTS 62-165355  7/1987  Japan.
1-64351  3/1989  Japan.

*Primary Examiner*—Rolf Hille
*Assistant Examiner*—Robert Limanek
*Attorney, Agent, or Firm*—Stanley N. Protigal

[57] ABSTRACT

A process for fabricating n-channel and p-channel metal-oxide-semiconductor devices in the manufacture of very large scale integrated circuits, such as high density dynamic random access memories (DRAMs). n-channel and p-channel gate layers of selected conductive and non-conductive materials are initially formed on the surface of a semiconductor substrate, and the n-channel gate layers in a memory array and periphery section of the substrate are initially photodefined, leaving the p-channel gate layers in place over an area of the substrate where future p-channel transistors and P+ active area will be formed. A series of ion implantation steps are then carried out to form the n-channel transistors, therefore using no masking steps, since the in-place gate layers on the p-channel peripheral section serves as an ion implantation mask over this section and thus prevents n-type ions from entering the p-type transistor areas of the peripheral section. Then, the completed n-channel transistors memory section is appropriately masked prior to photo-defining the transistor gate electrodes for either p or n-type transistors in the peripheral section of the substrate. Using this process, not only are the total number of necessary ion implantation masking steps held to an absolute minimum, but the p-channel peripheral section circuits such as sense amplifiers, decoders and drivers, logic circuits, and the like are exposed to a minimum of temperature cycling, thereby enhancing device reliability and improving the high frequency performance of the devices thus produced.

17 Claims, 9 Drawing Sheets

FABRICATION OF COMPLEMENTARY N-CHANNEL AND P-CHANNEL CIRCUITS (ICS) USEFUL IN THE MANUFACTURE OF DYNAMIC RANDOM ACCESS MEMORIES (DRAMS)

CROSS REFERENCE TO RELATED APPLICATIONS

This application is a continuation of application Ser. No. 07/779,222 filed Oct. 18, 1991, now abandoned, which is a continuation-in-part of U.S. patent application Ser. No. 450,445 filed Dec. 11, 1989, now U.S. Pat. No. 5,073,509 and is a continuation-in-part of U.S. patent application Ser. No. 85,007, filed Feb. 26, 1990, now abandoned, which is a continuation in part of U.S. patent application Ser. No. 189,411, filed May 2, 1988, now U.S. Pat. No. 4,957,878, U.S. patent pplication Ser. No. 189,414, filed May 2, 1988, now abandoned, and U.S. patent application Ser. No. 189,412, filed May 2, 1988, now U.S. Pat. No. 4,871,688.

FIELD OF THE INVENTION

This invention relates to VLSI semiconductor CMOS processes, and more specifically to implants of dopant into p well and n well regions to fabricate n-channel and p-channel memory arrays and associated peripheral circuitry. The invention is particularly applicable to dynamic random access memory devices (DRAMS).

BACKGROUND OF THE INVENTION

An electronic circuit is chemically and physically integrated into a substrate such as a silicon wafer by patterning regions in the substrate, and by patterning layers on the substrate. These regions and layers can be conductive, for conductor and resistor fabrication. They can also be of differing conductivity types, which is essential for transistor and diode fabrication. Degrees of resistance, capacitance, or conductivity are controllable, as are the physical dimensions and locations of the patterned regions and layers, making circuit integration possible.

In this disclosure, "n" denotes silicon that has been doped with atoms having more than four valence electrons (group V or higher), such as arsenic or phosphorus, which introduce negatively charged majority carriers into the silicon, and "p" denotes silicon doped with atoms having less than four valence electrons (group III or lower), such as boron, which introduce positively charged majority carriers. The majority charge carrier type is also referred to as conductivity type. A plus or minus superscript on an n or p indicates heavy or light doping, respectively. "Poly" denotes polycrystalline silicon.

Where electrical functions and connections are described, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" is therefore intended to include components which are in electrical communication despite intervening components.

Dynamic random access memory (DRAM) cells which utilize both n-channel and p-channel transistors and associated bit or digit lines are generally well known in the art and have been fabricated using state-of-the-art photolithographic masking and etching techniques and ion implantation doping processes. Some of these DRAM cells employ a stacked capacitor arrangement wherein an integrated circuit storage capacitor is photodefined and formed on top of the bit lines of the DRAM cell and is operated to receive, store, and transfer electrical charge to and from the bit line through the word line transistors during memory circuit operation. One such stacked capacitor-type of DRAM integrated circuit is disclosed by Kimura et al. in an article entitled "A New Stacked Capacitor DRAM Cell Characterized By A Storage Capacitor On A Bit Line Structure", International Electron Device Meeting (IEDM), 1988, at pages 596-599 of the *IEDM Proceedings*, incorporated herein by reference.

The conventional approach to fabricating these stacked capacitor DRAM cells of the type disclosed in the above publication by Kimura, et al. is to initially photodefine and thus form the n-channel and p-channel transistor gates on the surface of a semiconductor substrate in a single photo step and then provide photomasked ion implantation doping for NMOS and PMOS transistor gates. Using this process, the formation of the ion implantation steps for both n-channel and p-channel transistors in both the memory data storage area and the peripheral interconnecting circuit area of the semiconductor substrate are processed in parallel. With this conventional flow of defining both NMOS and PMOS transistors in a single mask step, it is required to photo mask the PMOS devices, as the required NMOS ion implantations are complete; and likewise for the required PMOS implants. This meant, for example, that the p-channel transistors and the n-channel transistors had to be alternately masked against ion implantation doping of the other transistor conductivity type during the formation of the n-channel and p-channel transistors. Since each type of transistor (NMOS and PMOS) requires at least two ion implantation doping steps, this in turn meant that five masking steps alone were required for forming the above n-channel and p-channel DRAM memory array and peripheral driver circuitry therefor.

The requirement for this large number of masking steps in order to provide the above necessary selective ion implantation into the semiconductor substrate translates into increased wafer processing costs and lower process yields and device reliability. In addition, the above prior art process in which the p-channel and n-channel transistors are processed in parallel as described exposes the peripheral PMOS circuitry to all of the temperature cycling used in the construction of the memory array data storage circuitry. This fact can in turn have an adverse effect on the reliability and performance of the p-channel devices in the peripheral array circuitry, and minimizes the scalability of the PMOS devices. The added temperature cycling is more detrimental for PMOS devices due to the higher diffusivity of boron (used for PMOS S/D's compared to As (used for NMOS S/D's). These peripheral devices include, for example, logic arrays, sense amplifiers, decoder and driver circuits and the like which are typically constructed on the peripheral area of the semiconductor substrate closely adjacent to the memory array area therein. As an example, the above temperature cycling exposure of the peripheral array circuitry during the above parallel processing means that PMOS P+ S/D junctions formed in the peripheral array circuitry early in the overall process are then exposed to the temperature cycling of the entire process. This in turn tends to drive the PMOS P+ S/D junctions of the peripheral array circuitry deeper into the semiconductor substrate, which decreases the scaleability of the PMOS transistors. Thus, this processing characteristic has a tendency to degrade the high frequency performance of these types of circuits where shorter channel PMOS transistors would otherwise be preferred.

The split poly DRAM process dramatically reduces the number of process steps, including masking steps, which has a direct impact on the cost, reliability, and manufacturability of the product. Latest generation DRAM products require scaling down to finer and finer geometries. This has a big impact on the cost of doing a photolithographic step. The source of this added cost comes from many sources. There are high capital costs associated with "state of the art" photolithographic equipment. Finer geometries require more complex photo processing in terms of more photo process steps per level and more equipment required, adding cost and using expensive ultra clean room floor space. Defect density is inevitably increased with each additional photomasking layer and compromises line yield, probe yield, and reliability. All photo layers require a subsequent step, either implant or etch. These are added steps adding to cost.

The reverse poly process was developed, initially for an NMOS process in order to reduce mask steps and provide improved alignment of circuit components formed by the multiple mask steps of a DRAM process. An embodiment of that process which used two polysilicon layers is described in U.S. Pat. No. 4,871,688.

While the invention is described in terms of DRAMs, this is merely the preferred embodiment for which the inventive techniques were developed. DRAM process techniques are also applicable to related semiconductor circuit devices, including video random access memories (VRAMs) and other multiport RAMS, and other devices which use DRAM design techniques, such as optical sensing arrays. Significantly, DRAM process techniques are usually applicable to other types of semiconductor devices as well. In this respect, DRAM technology is considered to be a "driving technology" for other integrated circuit technology, and therefore the inventive techniques are expected to be applicable for other types of integrated circuits.

SUMMARY OF INVENTION

The general purpose and principal object of this invention is to provide a novel alternative approach with respect to the above prior art parallel processing approach which has the effect of increasing process yields while simultaneously reducing manufacturing costs and increasing device performance.

Another object of this invention is to provide a new and improved process for forming n-channel and p-channel complementary integrated circuit structures which may be carried out in a sequential manner such that p-channel devices in circuitry peripheral to the main memory array are not exposed to all of the transistor and bit line processing steps and associated temperature cycling used in the construction of the main memory array. This feature in turn improves the overall device reliability and operational performance of the integrated circuits thus produced.

To accomplish this purpose and related objects, there has been discovered an developed a new and improved complementary n-channel and p-channel metal-oxide-semiconductor (MOS) process wherein multilevel layers of conductive and insulating transistor gate material are formed and extended across both a main memory array section and a peripheral array section of a semiconductor substrate. n-channel transistor gates are then photodefined and formed, including those within the main memory array section of the semiconductor substrate, while leaving in place the gate electrode layers on the p-channel transistors.

In a preferred embodiment of the invention, the bit or digit lines in the memory array section of the device are provided with stacked capacitor structures formed adjacent to access transistors therein for providing charge storage capability for the integrated circuit memory. Additionally, isolating oxide spacers are provided on both the sidewalls of the p-channel and n-channel transistor gate electrodes in both the memory and peripheral sections of the device and also adjacent to the digit/bit line structures within the memory array section. These isulating spacers serve to provide the necessary electrical isolation between various components of the integrated circuit devices being fabricated and are useful to optimize the overall operational and high frequency performance of these devices.

The above objects, advantages and other novel features of this invention will become more readily apparent from the following description of the accompanying drawings.

BRIEF DESCRIPTION OF THE DRAWINGS

FIG. 1 shows the wafer with n wells defined, gate oxide ("gate ox"), field oxide ("field ox"), on which a first layer of polysilicon, $WSi_x$, and a dielectric layer. The wafer has been etched;

FIG. 2 shows the formation of insulating side walls and the further doping of the p-well portion of the wafer;

FIG. 3 shows a deposited layer of dielectric, on which a silicided layer and dielectric is superimposed;

FIG. 4 shows the etching of the silicided layer;

FIG. 5 shows the etching and doping of the wafer over the n wells to form transistor gates;

FIG. 6 shows sidewall formation and the use of a blanket $BF_2$ implant;

FIG. 7 shows the deposition of a poly 4 layer to form capacitor plates;

DETAILED DESCRIPTION OF THE PREFERRED EMBODIMENTS

Figure 1:
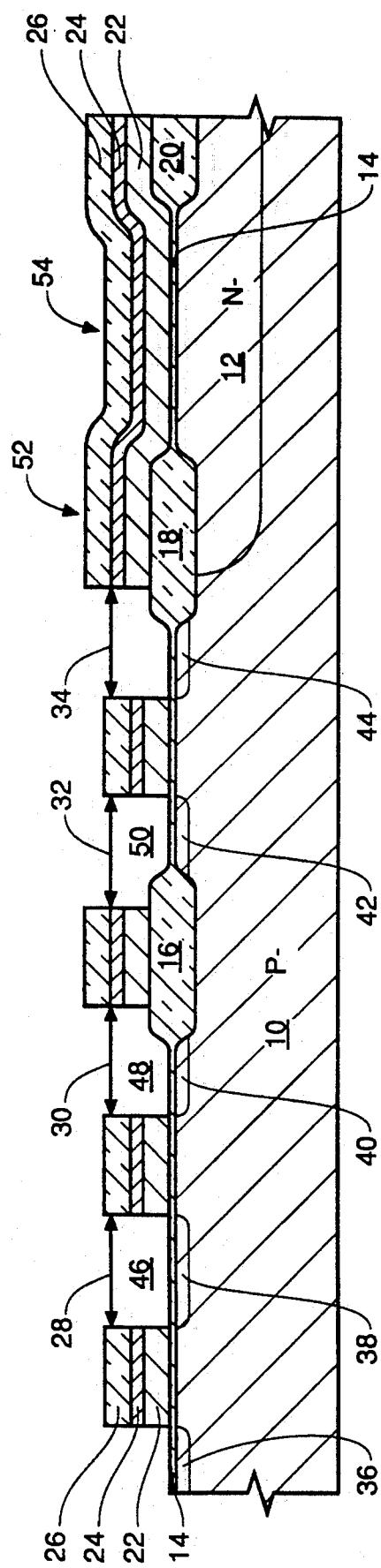
FIGS. 1 through 7 are a series of abbreviated schematic cross-section views illustrating the significant wafer processing steps used in sequence in a preferred embodiment of this invention. It should be understood, however, that many intermediate processing steps such as those used in both conductor and non-conductor layer formation and subsequent ion implantation mask definition using conventional well known layer deposition and photolithographic masking and etching techniques have been omitted for sake of brevity and to better highlight the main process steps to which the appended claims are directed.

Referring now to FIG. 1, there is shown a starting semiconductor substrate 10 which, in the example given, is p-type silicon in which an n-type well 12 has been formed using conventional ion implantation or diffusion doping processes.

The upper surface of the p-type silicon substrate 10 is treated in a conventional manner using well known oxide deposition and masking and etching processes to form a thin surface gate dielectric 14. Preferably the gate dielectric 14 is an oxide layer of $SiO_2$ extending laterally across the entire upper surface of the substrate 10 and merging into a plurality of thicker field oxide sections 16, 18, and 20 as shown. The thicker field oxide sections 16, 18, and 20 are used, as is well known, to provide electrical isolation of transistors and other electrical devices which are fabricated on each side of these thicker field oxide sections 16, 18, and 20 in the manner described below.

The integrated circuit structure of FIG. 1 is initially treated so as to form three continuous conformal layers 22, 24, and 26 completely across the surface of the structure and deposited in succession using semiconductor and insulator layer forming processes which are individually well known in the art and are described in further detail below. The first layer 22 is polycrystalline silicon and is also referred to herein as poly 1; the second layer 24 is tungsten silicide and is also referred to herein as $WSi_x$-1. The third layer 26 is a layer of silicon dioxide, $SiO_2$, and is also referred to herein as oxide 1.

After the three layers 22, 24, and 26 of polysilicon, tungsten silicide, and silicon dioxide, respectively, are deposited across the entire surface of the p-type silicon substrate 10 including the n-type well portion 12 as indicated, conventional state-of-the-art photolithographic masking and etching processes are used to form a plurality of openings 28, 30, 32, and 34 completely through the three previously described conformal layers 22, 24, and 26. After these openings 28, 30, 32, and 34 have been formed as shown, the integrated circuit substructure shown in FIG. 1 is transferred to a conventional ion implantation station and implanted with n-type ions, such as phosphorus, to thereby form a corresponding plurality of n-type surface channel regions 36, 38, 40, 42, and 44 for the transistors and other devices of the integrated circuit being fabricated.

The region 46 shown in FIG. 1 has been created for the purpose of housing a future bit line or digit line contact, whereas the region 48 shown therein has been created for the purpose of housing a future storage node contact for a storage capacitor of the integrated circuit. Continuing from left to right as shown in FIG. 1, the region 50 shown therein has been created for the purpose of housing a future spacer insulating region, and the areas 52 and 54 of the integrated circuit structure shown in FIG. 1 will be processed to receive from left to right a future hedge isolation barrier and a future p-channel transistor.

The above described phosphorous ion implantation step used to form the various n-type regions 36, 38, 40, 42, and 44 has been referred as the lightly doped drain (LDD) implant which is used to set the gate voltage or turn on voltage, $V_T$, of the transistors which are formed on the surface of the silicon substrate 10. After this implantation step has been completed, the structure shown in FIG. 1 is transferred first to a spacer oxide deposition and anisotropic etching station wherein a plurality of spacer oxide regions of silicon dioxide are formed around the edges of all four of the previously defined islands or patterns previously created within the polysilicon, tungsten silicide, and silicon dioxide layers 22, 24, and 26 as shown.

Figure 2:
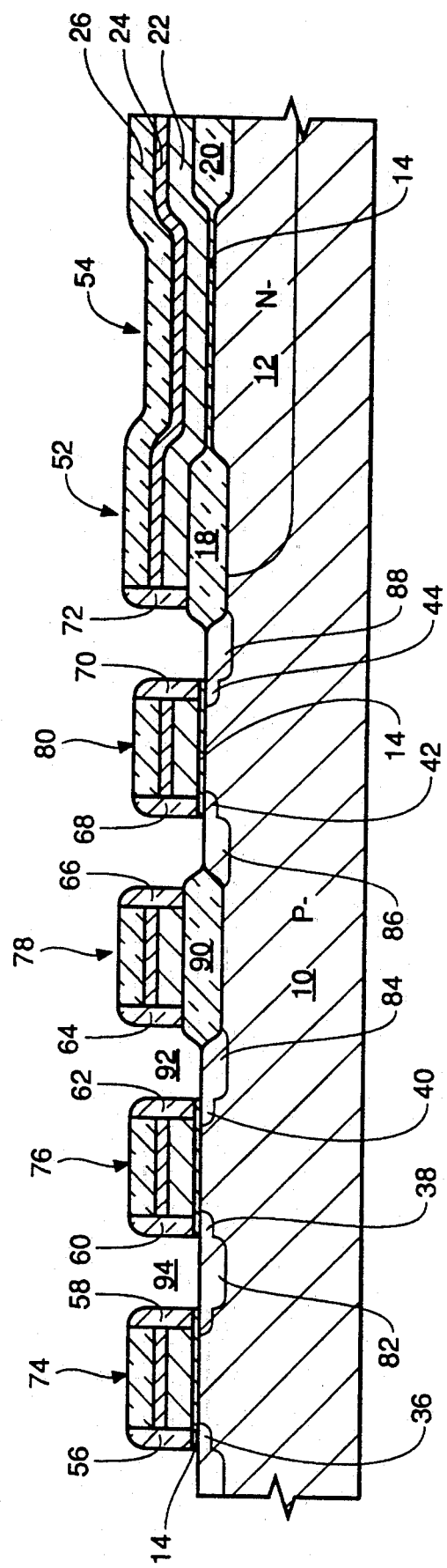

Referring now to FIG. 2, these silicon dioxide spacers are identified in this figure as the various side wall regions 56, 58, 60, 62, 64, 66, 68, 70, and 72 which are etched in the conformal geometry shown on the side of four composite islands 74, 76, 78, and 80 of the polysilicon, tungsten silicide and silicon dioxide. These spacers are also simultaneously formed on the sides of the future hedge portion 52 above the field oxide region 18 and surrounding the p-type transistor 54 areas shown on the right side of FIG. 2. As is well known in the art, the spacer oxide regions 56, 58, 60, 62, 64, 66, 68, 70, and 72 which serve to electrically isolate various devices formed on the silicon chip are formed by first depositing a continuous oxide layer (not shown) over all of the exposed upper surfaces of the entire structure shown in FIG. 1 and then applying an anisotropic etchant to the deposited $SiO_2$ layer so that the spacer oxide previously covering the tops of the composite layer islands 74, 76, 78, and 80 is removed. This step is carried out using an anisotropic dry etch and thereby leaves the oxide spacers 56, 58, etc. in the conformal geometry shown in FIG. 2. Thus, the spacer oxide in areas such as regions 58 and 60, for example, can now serve as an ion implantation mask for the ion implantation step used to form the deeper arsenic ion implants into and through the central region 82 of the lightly doped drain implant 38 for the access transistor structure 76.

This arsenic ion implantation step also forms the deeper arsenic implanted regions 84, 86, and 88 as shown from left to right as viewed in FIG. 2 and also forms the n+ storage nodes for a stacked capacitor structure being formed the above region 84 on the left hand side of the field oxide region 90. This field oxide region 90 will serve to electrically isolate the stacked capacitor cell to be fabricated within the open region 92 on one side of the composite layer island 78 from other devices to be formed to the right hand side of the island 78. Thus, the oxide spacers such as 58 and 60 serve the dual purposes of electrically isolating the adjacent islands such as 74 and 76 shown in FIG. 2 and also functioning as an ion implantation mask to space out the deeper arsenic implanted regions 82 through which electrical charge is transferred back and forth from an access transistor. This access transistor is constructed within the island 76 shown in FIG. 2 and charge is transferred to and from this transistor to a future bit or digit line contact which will be subsequently formed in the region 94 as shown in FIG. 2.

Figure 3:
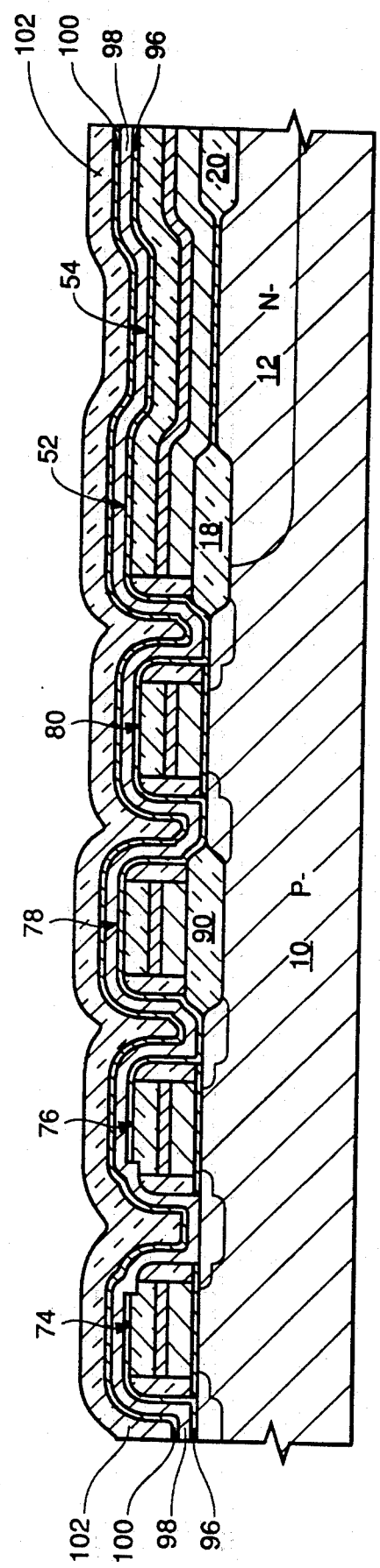

Referring now to FIG. 3, the schematic cross-section and abbreviated view shown in this figure is intended to illustrate first the formation of a thin layer 96 of silicon dioxide which has been deposited on the exposed upper surfaces of the integrated circuit structure shown in FIG. 2 to a thickness of about 1500Å and using a standard tetraethylorthosilicate (TEOS) oxide deposition process. After the formation of the TEOS silicon dioxide layer 96 is complete, a subsequent layer 98 of polycrystalline silicon (or poly 2) is formed as shown on the upper surface of the $SiO_2$ layer 96, and thereafter a second layer 100 of tungsten silicide, $WSi_x$, is formed as shown on the upper surface of the second layer 98 of polycrystalline silicon.

After the completion of the three additional conformal layers 96, 98, and 100 as described above, the intermediate structure being processed is transferred to an oxide deposition station where a thick covering layer 102 of approximately 4500Å of silicon dioxide is deposited in a tetraethylorthosilicate or TEOS oxide deposition process so as to cover the entire exposed upper surface of the second tungsten silicide layer 100 as shown.

Figure 4:
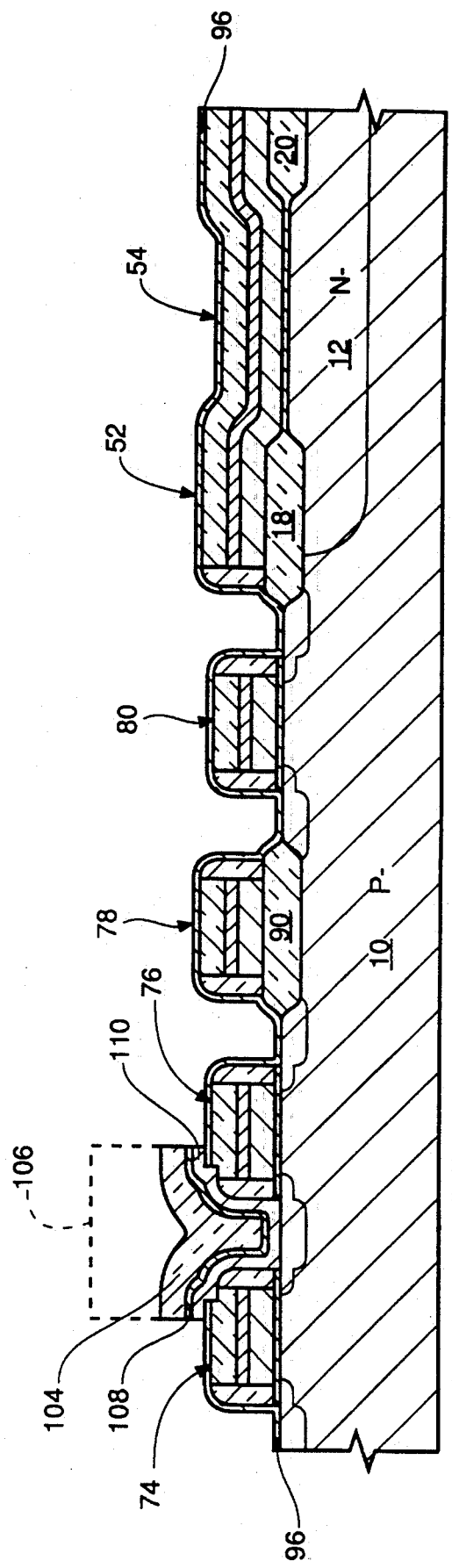

Referring now to FIG. 4, the previously formed thick TEOS silicon dioxide layer 102 described above with reference to FIG. 3 is selectively masked only in the region 104 as shown on the left hand side of FIG. 4 and using a strip 106 of photoresist as shown. The photoresist mask 106 serves to protect the TEOS SiO₂ oxide strip 104 which in turn is used to protect the bit or digit line extending in the region 94 (see FIG. 2) between the composite islands 74 and 76 first described above with reference to FIGS. 1 and 2. The etching step which is used to etch away the thick TEOS SiO₂ layer 102 and thereby leave the strip 104 of thick oxide on the bit line formed in region 94 continues to etch on through the underlying layers of tungsten silicide 108 and polysilicon (poly 2) 110 as best seen on the left hand side of FIG. 4.

The etching process step used to define the above geometry in the stacked layers 104, 106, 108, and 110 as shown continues downwardly to the surface of the previously formed TEOS layer 96 and then continues to etch somewhat into the surface of the TEOS oxide layer 96. This etching step thereby reduces the thickness of the SiO₂ layer 96 from its approximately 1500Å original thickness down to a new thickness on the order of about a 1000Å.

Figure 5:
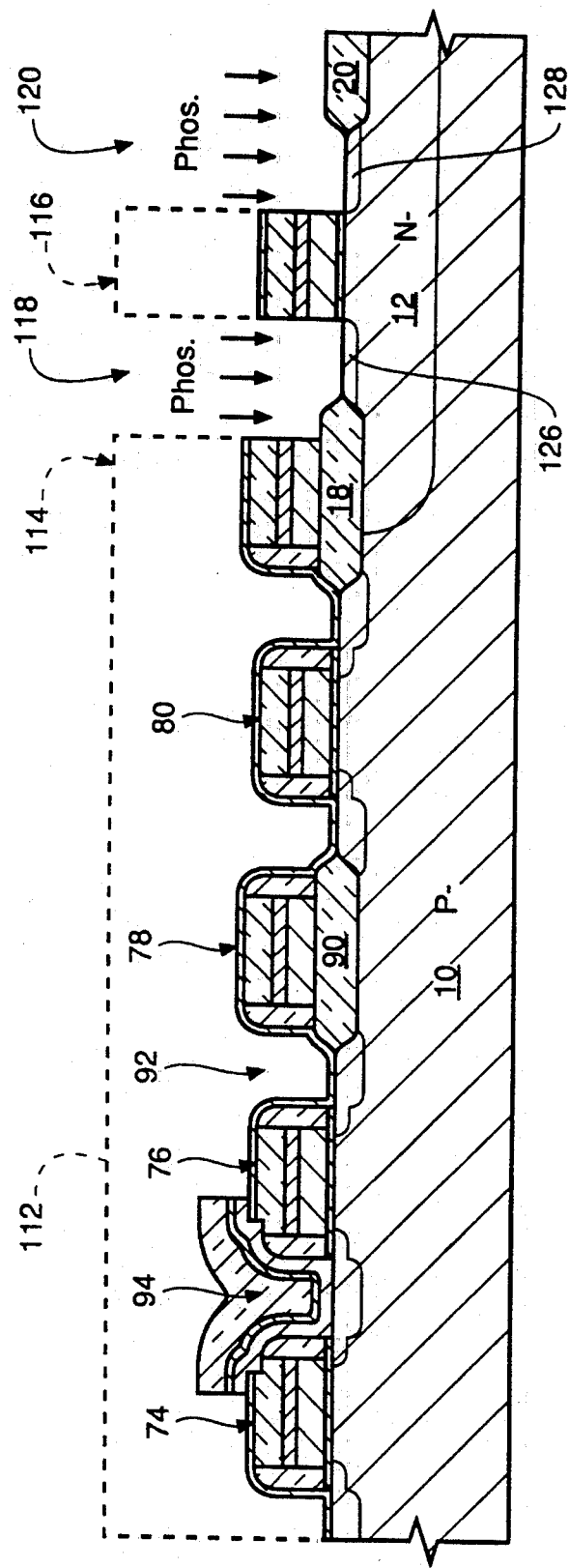

The intermediate integrated circuit structure shown in FIG. 4 is again transferred to a conventional photoresist deposition and masking station wherein a thick pattern 112, 114 of photoresist is deposited and formed in the geometry shown in FIG. 5. Using this masking process, all of the digit or bit lines, access transistors, and storage capacitors being fabricated in the earlier defined regions 94, 76, 92, and 78 in FIG. 2 are now completely masked by the photoresist pattern 112 against a subsequent ion implantation step which is used to fabricate either a p-channel transistor or an n-channel transistor within the n-type well 12 for the peripheral devices of the integrated circuit as shown in the lower portion of FIG. 5.

Thus, whereas the photoresist pattern 112 shown in the left side of FIG. 5 now completely covers the devices in this section of the integrated circuit and silicon chip within the main memory area of the integrated circuit chip, the photoresist pattern 114 as shown in the right side of FIG. 5 has been configured in the geometry illustrated so as to provide the openings 118 and 120 in preparation for a subsequent p-type BF₂ ion implantation into the peripheral device lower structure of this figure. This BF₂ p-type ion implantation step is indicated by the P type ions which are used to form the p+source and drain regions 126 and 128 of a p-channel transistor which is shown centrally located within the previously formed n-type well region 12. This forms an n-type phosphorous "halo" implant to improve short channel PMOS device performance.

Figure 6:
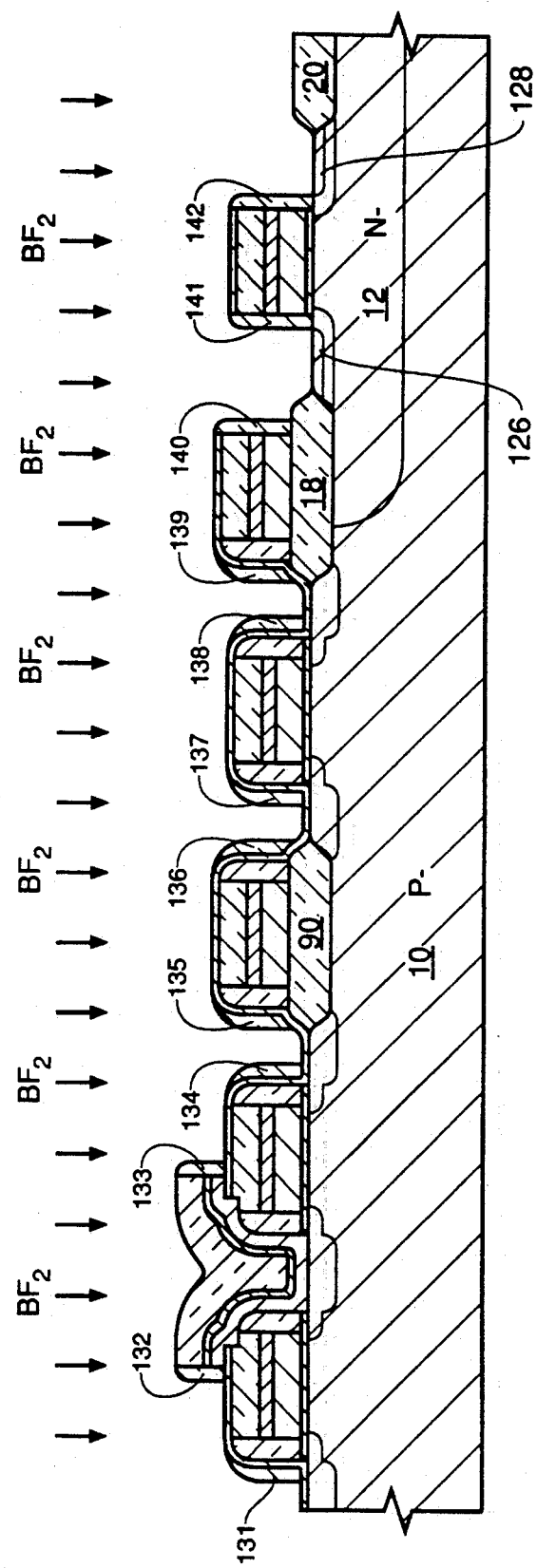

Referring now to FIG. 6, the thick photoresist mask 112, 114, previously described with reference to FIG. 5 above, has been removed. After the photoresist mask removal, a second plurality of silicon dioxide spacers 131-142 are formed. These oxide spacers 131-142, as shown in FIG. 6, are formed in the similar manner as that used above to form the initial SiO₂ spacers described in correction with FIG. 2. This process involves a combination of silicon dioxide layer deposition and subsequent anisotropic etching and does not require any masking in order to form the conformal regions etc. of the spacers 131-142 shown in FIG. 6. These spacers are used to provide electrical isolation between the various circuit devices being formed. In particular, the spacers are used to provide isolation between digit line and future poly 3 storage nodes.

At this time, it is possible to provide a BF₂ implant, which provides a source/drain implant for the p channel transistors. While the BF₂ is a p-type implant, the thin layer of oxide 96 or the photoresist layer 112 (FIG. 5) precludes significant implantation into the p-type silicon substrate 10. To the extent that the BF₂ is implanted into the p-type silicon substrate 10, that substrate 10 is a compensated for by other implants in order to avoid the need for an additional photomask. Alternatively, it is possible to provide the BF₂ implant at a later stage, as described in connection with FIG. 9.

Figure 7:
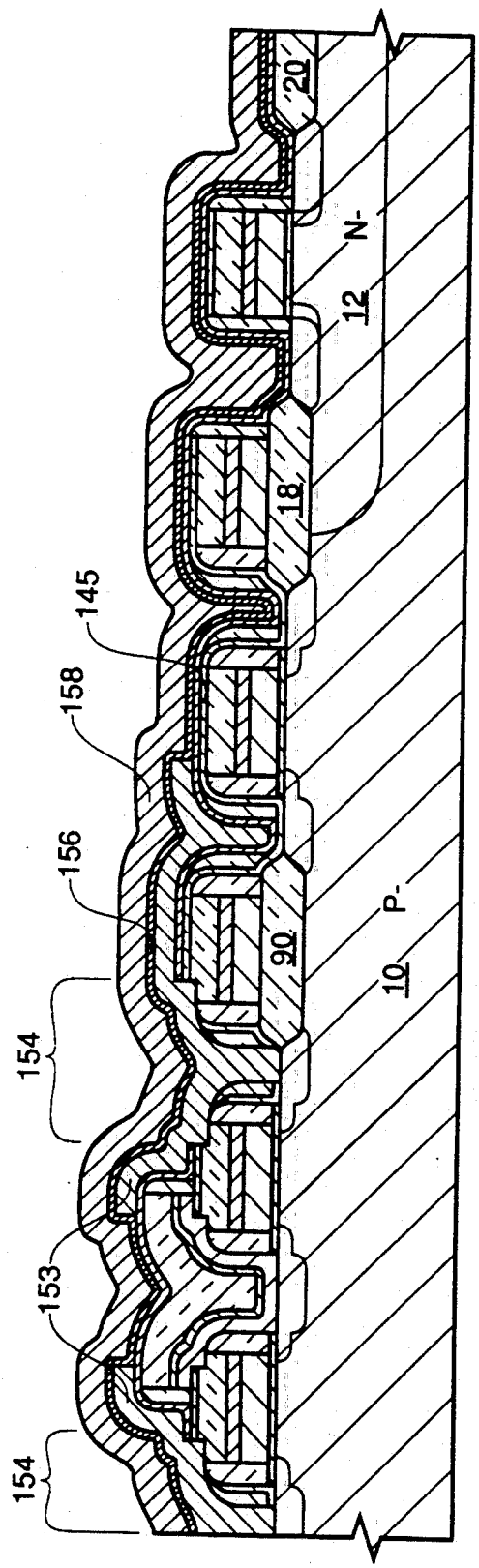

Referring now to FIG. 7, the structure described above with reference to FIG. 6 is initially transferred to a deposition station where the thin layer of oxide 145 is deposited on the exposed surfaces of the integrated circuit structure shown in FIG. 2. The thin layer of oxide 145 is preferably deposited as TEOS oxide.

The structure is then etched to provide openings 152, as shown in FIG. 7. A third layer 153 of polysilicon located in the region 154 of the IC structure forms one layer of a stacked capacitor being formed over the thick field oxide region 90 previously described in connection with FIG. 2.

Next, a thin capacitor cell dielectric layer 156 of silicon nitride (Si₃N₄) is deposited to a thickness of approximately 100Å over the exposed surface of the third polysilicon layer 153 to thereby provide the desired high dielectric constant and small thickness for the capacitor dielectric layer to thereby maximize the capacitance per unit area for the stacked capacitor being formed. Then, a fourth layer 158 of polycrystalline silicon (poly 4) is deposited over the upper surface of the thin silicon nitride, Si₃N₄ 156 shown in FIG. 7 to form the second and upper plate of the stacked capacitor cell which is constructed in the general region 154 over the thick field oxide 90. The thin layer 156 of Si₃N₄ is also formed over the exposed surfaces of the right hand or peripheral section of the integrated circuit as viewed in this figure so as to leave a protective coating over this section of the integrated circuit.

Figure 8:
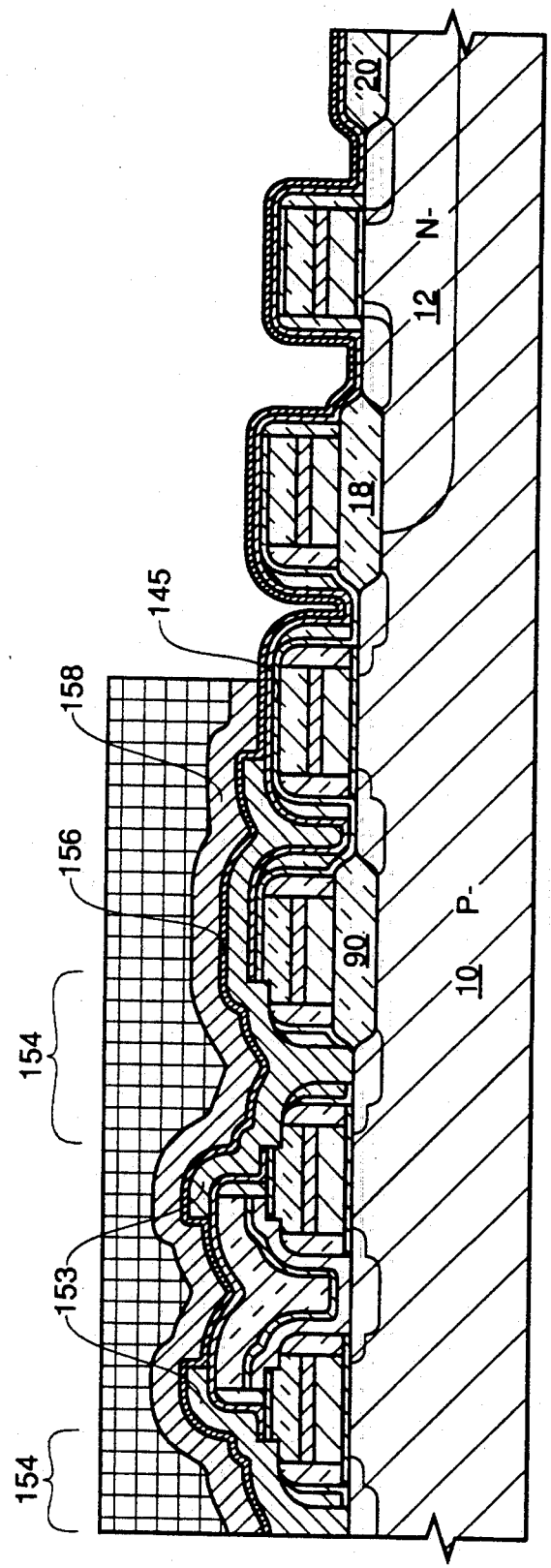
FIG. 8 shows the etching of the poly 4 from the periphery.
Figure 9:
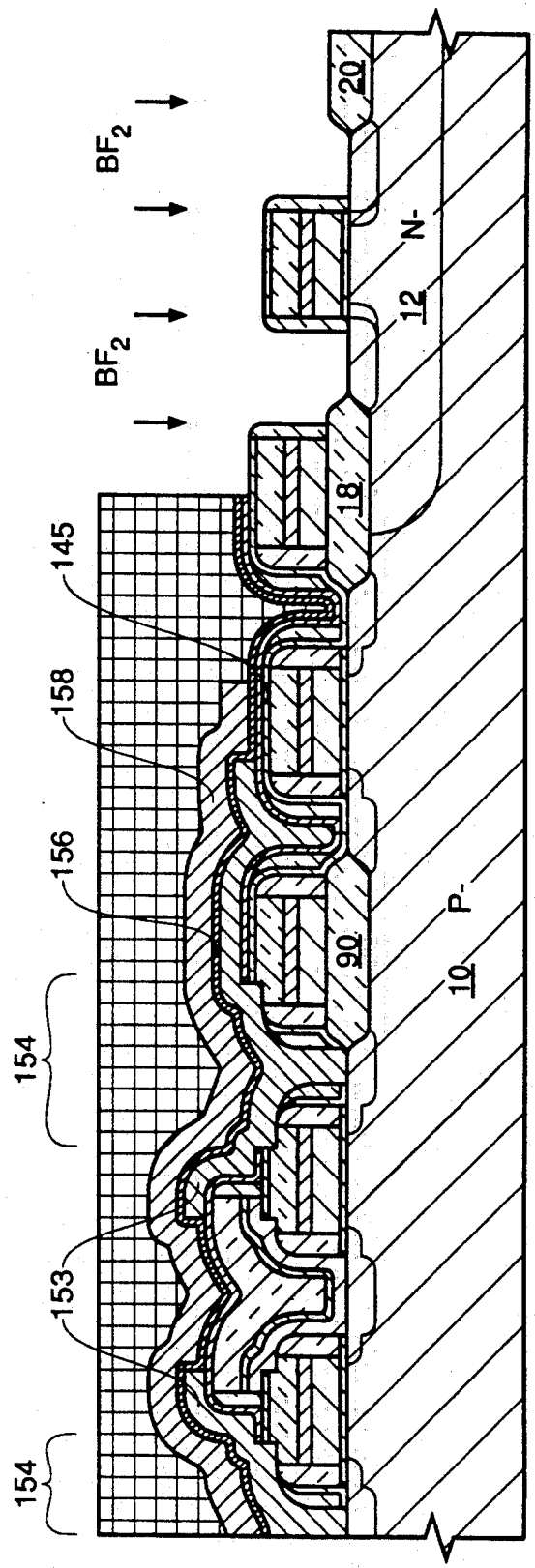
FIG. 9 shows an optional implant step used in the periphery.

As shown in FIG. 8, the top poly 4 layer is removed from the periphery of the wafer, including PMOS transistors. This allows subsequent metal mask connection of the circuitry in the periphery, and further allows an optional BF₂ implant to be applied to the periphery PMOS transistors. A mask may be used in order to avoid blanket implantation of the BF₂, as shown in FIG. 9.

Various modifications may be made in an to the above described embodiment without departing from the spirit and scope of this invention. In addition, it will understood by those skilled in the art that the above abbreviated illustrations of the formation of only a single bit or digit line, a single access transistor, a single stacked capacitor storage cell and associated word lines on each side thereof, and a single p-channel transistor in the peripheral area of the integrated circuit structure are merely representative of many hundreds and possibly thousands of these devices which may be simultaneously formed during a large scale integrated circuit batch fabrication process. Accordingly, these and other applications of the above novel concepts and solution to the problems described with respect to processes of the prior art are clearly within the scope of the following appended claims.

We claim:

1. An integrated circuit having complementary n-channel and p-channel devices therein and fabricated by the process of:
   a) defining PMOS and NMOS regions, and forming multi-level layers of conductive and non-conductive transistor gate materials extending across a memory array section and an adjacent peripheral array section of a semiconductor substrate being processed to form a semiconductor device;
   b) photo-defining n-channel transistor gates within said memory array section and within NMOS regions in said peripheral array section, while leaving in place said gate electrode layers over the future transistor regions within PMOS regions in said peripheral array section;
   c) implanting n-type dopant ions into regions of said memory array section adjacent to said n-channel transistor gates for bit or digit lines for said n-channel transistors and into said NMOS regions in said peripheral array section;
   d) depositing and etching dielectric spacers simultaneously into said memory array section into said NMOS regions in said peripheral array section, thereby forming identical spacers on both said memory array section into said NMOS regions in said peripheral array section;
   e) implanting source/drain regions into said memory array section into said NMOS regions in said peripheral array section;
   f) depositing dielectric and forming digit line contacts;
   g) depositing and photoetching digit lines;
   h) defining p-channel transistors;
   i) forming dielectric spacers simultaneously to digit lines and PMOS transistors, thereby forming identical spacers on both said digit lines and said PMOS transistors;
   j) forming stacked capacitor structures on top of said bit or digit lines for said n-channel transistors, wherein conducting transistor gate material forming the word lines in the array and NMOS and PMOS transistors in the periphery have identical film structures;
   k) photo-defining p-channel transistor gates within said peripheral array section of said semiconductor substrate, while leaving said memory array section thereof masked against ion implantation; and
   l) subsequent to the step of forming dielectric spacers simultaneously to digit lines and PMOS transistors, implanting p-type of n-type dopant ions into regions of said peripheral array section adjacent to either p-channel or n-channel transistor gates therein, respectively, to form bit or digit lines within said peripheral array section, whereby high performance and high frequency p-n junction devices are formed while being exposed to a minimum of temperature cycling and ion-implantation masking steps.

2. An integrated circuit as defined in claim 1, further including:
   insulating spacers formed on sidewalls of said n-channel and p-channel gates to improve the short channel characteristics of p-channel and n-channel transistors and bit lines, and further forming insulating spacers between adjacent stacked capacitor structures and located on top of said n-channel transistor gates.

3. An integrated circuit as defined in claim 1, further including:
   said n-channel and p-channel gates being constructed by forming a first level of polycrystalline silicon followed by a second layer of tungsten silicide followed by a third layer of silicon dioxide.

4. An integrated circuit as defined in claim 1, further including:
   said stacked capacitor structures being constructed by forming a first level of polycrystalline silicon followed by a second level of tungsten silicide followed by a third level of silicon dioxide followed by an overlying capacitor plate layer.

5. An integrated circuit as defined in claim 4, further including:
   said n-channel and p-channel gates being constructed by forming a first level of polycrystalline silicon followed by a second layer of tungsten silicide followed by a third layer of silicon dioxide.

6. An integrated circuit as defined in claim 1, further including:
   said n-channel and p-channel gates and said stacked capacitor structures are constructed by forming a first layer of polycrystalline silicon adjacent to the surface of said semiconductor substrate followed by a second layer of tungsten silicide formed atop said polycrystalline silicon layer, followed by a third layer of silicon dioxide formed atop said tungsten silicide layer.

7. An integrated circuit having complementary n-channel and p-channel devices therein and fabricated by the process of:
   a) defining PMOS and NMOS regions, and forming multi-level layers of conductive and non-conductive transistor gate materials extending across a memory array section and an adjacent peripheral array section of a semiconductor substrate being processed to form a semiconductor device;
   b) photo-defining n-channel transistor gates within said memory array section and within NMOS regions in said peripheral array section, while leaving in place said gate electrode layers over future transistor regions within PMOS regions in said peripheral array section;
   c) implanting n-type dopant ions into regions of said memory array section adjacent to said n-channel transistor gates for bit or digit lines for said n-channel transistors and into said NMOS regions in said peripheral array section;
   d) depositing and etching dielectric spacers simultaneously into digit lines of said memory array section into said NMOS regions in said peripheral array section, thereby forming identical spacers on both said memory array section into said NMOS regions in said peripheral array section;
   e) implanting source/drain regions into said memory array section into said NMOS regions in said peripheral array section;
   f) depositing a dielectric layer;

g) etching through the deposited dielectric layer in order to form bit contact openings;

h) depositing a further conductive layer;

i) defining p-channel transistors;

j) simultaneously forming spacers for both digit lines and PMOS transistors, thereby forming identical spacers on both said digit lines and said PMOS transistors, wherein said dielectric spacers for bit lines isolate digit line sidewalls from subsequent storage capacitor plates;

k) forming a capacitor structures in said memory array, wherein conducting transistor gate material forming the word liens in the array and NMOS and PMOS transistors in the periphery have identical film structures;

l) photo-defining p-channel transistor gates within said peripheral array section of said semiconductor substrate, while leaving said memory array section thereof masked against ion implantation; and m) subsequent to the step of forming dielectric spacers simultaneously to digit lines and PMOS transistors, implanting dopant ions into regions of said peripheral array section adjacent to transistor gates therein.

8. An integrated circuit as defined in claim 7, further including:

insulating spacers formed on sidewalls of said n-channel and p-channel gates to improve the short channel characteristics of p-channel and n-channel transistors and bit liens, and further forming insulating spacers between adjacent stacked capacitor structures and located on top of said n-channel transistor gates.

9. An integrated circuit as defined in claim 7, further including:

said n-channel and p-channel gates being constructed by forming a first level of polycrystalline silicon followed by a second layer of tungsten silicide followed by a third layer of silicon dioxide.

10. An integrated circuit as defined in claim 7, further including:

said stacked capacitor structures being constructed by forming a first level of polycrystalline silicon followed by a second level of tungsten silicide followed by a third level of silicon dioxide followed by an overlying capacitor plate layer.

11. An integrated circuit as defined in claim 7, further including:

said n-channel and p-channel transistor gates being constructed by forming a first level of polycrystalline silicon followed by a second layer of tungsten silicide followed by a third layer of silicon dioxide.

12. An integrated circuit as defined in claim 11, further including:

said n-channel and p-channel gates and said stacked capacitor structures are constructed by forming a first layer of polycrystalline silicon adjacent to the surface of said semiconductor substrate followed by a second layer of tungsten silicide formed atop said polycrystalline silicon layer, followed by a third layer of silicon dioxide formed atop said tungsten silicide layer.

13. A DRAM integrated circuit having complementary n-channel and p-channel devices therein and fabricated by the process of:

a) patterning NMOS and word line transistors;

b) subsequent to patterning said NMOS and word line transistors, forming identical dielectric spacers for bit lines and NMOS transistors source/drain areas, and future isolation of wordlines and bitlines, thereby forming identical spacers on both said memory array section into said NMOS regions in said peripheral array section;

c) digit line deposition and patterning;

d) subsequent to said forming of said dielectric spacers and subsequent to said digit line deposition, patterning p channel semiconductor material;

e) simultaneously forming spacers for both digit lines and p channel transistors, thereby forming identical spacers on both said digit lines and said PMOS transistors, wherein said dielectric spacers for bit lines isolate digit line sidewalls from subsequent storage capacitor plates; and f) depositing storage capacitor plates, wherein conducting transistor gate material forming the word lines in the array and NMOS and PMOS transistors in the periphery have identical film structures.

14. A DRAM integrated circuit as defined in claim 13, further including:

insulating spacers formed on sidewalls of said n-channel and p-channel gates to improve the short channel characteristics of p-channel and n-channel transistors and bit lines, and further forming insulating spacers between adjacent stacked capacitor structures and located on top of said n-channel transistor gates.

15. A DRAM integrated circuit as defined in claim 13, further including:

n-channel and p-channel gates constructed by forming a first level of polycrystalline silicon followed by a second layer of tungsten silicide followed by a third layer of silicon dioxide.

16. A DRAM integrated circuit as defined in claim 13, further including:

stacked capacitor structures, said stacked capacitor structures being constructed by forming a first level of polycrystalline silicon followed by a second level of tungsten silicide followed by a third level of silicon dioxide followed by an overlying capacitor plate layer.

17. A DRAM integrated circuit as defined in claim 16, further including:

n-channel and p-channel gates and said stacked capacitor structures are constructed by forming a first layer of polycrystalline silicon adjacent to the surface of said semiconductor substrate followed by a second layer of tungsten silicide formed atop said polycrystalline silicon layer, followed by a third layer of silicon dioxide formed atop said tungsten silicide layer.

* * * * *